United States Patent
Lee et al.

(10) Patent No.: US 10,141,465 B2
(45) Date of Patent: Nov. 27, 2018

(54) EPITAXIAL LIFT-OFF PROCESSED GAAS THIN-FILM SOLAR CELLS INTEGRATED WITH NON-TRACKING MINI-COMPOUND PARABOLIC CONCENTRATORS

(71) Applicant: The Regents of the University of Michigan, Ann Arbor, MI (US)

(72) Inventors: Kyusang Lee, Ann Arbor, MI (US); Stephen R. Forrest, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 15/126,592

(22) PCT Filed: Apr. 6, 2015

(86) PCT No.: PCT/US2015/024532
§ 371 (c)(1),
(2) Date: Sep. 16, 2016

(87) PCT Pub. No.: WO2015/154080
PCT Pub. Date: Oct. 8, 2015

(65) Prior Publication Data
US 2017/0084769 A1     Mar. 23, 2017

Related U.S. Application Data

(60) Provisional application No. 62/127,278, filed on Mar. 2, 2015, provisional application No. 62/067,652, filed
(Continued)

(51) Int. Cl.
*H01L 31/054*     (2014.01)
*H01L 31/0203*    (2014.01)
(Continued)

(52) U.S. Cl.
CPC ...... *H01L 31/0547* (2014.12); *H01L 31/0203* (2013.01); *H01L 31/0304* (2013.01);
(Continued)

(58) Field of Classification Search
CPC ............. H01L 31/0547; H01L 31/0203; H01L 31/0304; H01L 31/184; H01L 31/0693; H01L 31/03926; Y02E 10/50
See application file for complete search history.

(56) References Cited

U.S. PATENT DOCUMENTS

| 4,440,153 A | 4/1984 | Melchior |
| 5,288,337 A | 2/1994 | Mitchell |

(Continued)

FOREIGN PATENT DOCUMENTS

| EP | 2 521 189 | 11/2012 |
| WO | WO 2008/024201 A2 | 2/2008 |

(Continued)

OTHER PUBLICATIONS

Carvalho et al., "Truncation of CPC Solar Collectors and its Effect on Energy Collection," Solar Energy, vol. 35, No. 5, pp. 393-399 (1985).

(Continued)

*Primary Examiner* — Savitr Mulpuri
(74) *Attorney, Agent, or Firm* — Finnegan, Henderson, Farabow, Garrett & Dunner, LLP

(57) ABSTRACT

There is disclosed a method of preparing a photovoltaic device. In particular, the method comprises making thin-film GaAs solar cells integrated with low-cost, thermoformed, lightweight and wide acceptance angle mini-CPCs. The fabrication combines ND-ELO thin film cells that are cold-welded to a foil substrate, and subsequently attached to the CPCs in an adhesive-free transfer printing process. There is also disclosed an improved photovoltaic device made by the
(Continued)

disclosed method. The improved photovoltaic device comprises a thin-film solar integrated with non-tracking mini-compound parabolic concentrators, wherein the plastic compound parabolic concentrator comprise two parabolas tilted at an angle equal to the acceptance angle of the compound parabolic concentrator.

27 Claims, 16 Drawing Sheets

Related U.S. Application Data on Oct. 23, 2014, provisional application No. 61/975,623, filed on Apr. 4, 2014.

(51) Int. Cl.
*H01L 31/0304* (2006.01)
*H01L 31/18* (2006.01)
*H01L 31/0693* (2012.01)
*H01L 31/0392* (2006.01)

(52) U.S. Cl.
CPC .... *H01L 31/03926* (2013.01); *H01L 31/0693* (2013.01); *H01L 31/184* (2013.01); *Y02E 10/50* (2013.01)

(56) References Cited

U.S. PATENT DOCUMENTS

| | | | |
|---|---|---|---|
| 5,939,733 | A | 8/1999 | Sato |
| 8,110,425 | B2* | 2/2012 | Yun ................ H01L 33/0079 257/E33.008 |
| 8,378,385 | B2* | 2/2013 | Forrest ............. H01L 21/7813 257/190 |
| 2004/0121568 | A1 | 6/2004 | Kim et al. |
| 2005/0081909 | A1 | 4/2005 | Paull |
| 2008/0048102 | A1* | 2/2008 | Kurtz ................ H01L 31/0547 250/226 |
| 2009/0044860 | A1 | 2/2009 | Pan et al. |
| 2010/0047959 | A1* | 2/2010 | Cornfeld ........... H01L 31/06875 438/94 |
| 2010/0317132 | A1 | 12/2010 | Rogers et al. |
| 2011/0094564 | A1* | 4/2011 | McCall ................. F24J 2/12 136/246 |
| 2011/0240104 | A1 | 10/2011 | Lee et al. |
| 2011/0266561 | A1 | 11/2011 | Rogers et al. |
| 2012/0138122 | A1* | 6/2012 | Whitlock ............ H01L 31/0547 136/246 |
| 2013/0037095 | A1* | 2/2013 | Forrest .............. H01L 31/03046 136/256 |
| 2013/0043214 | A1* | 2/2013 | Forrest ................ H01L 31/1896 216/95 |
| 2013/0228221 | A1 | 9/2013 | Moslehi et al. |
| 2014/0338726 | A1 | 11/2014 | Nobori |
| 2016/0329457 | A1 | 11/2016 | Forrest et al. |

FOREIGN PATENT DOCUMENTS

| | | |
|---|---|---|
| WO | WO 2011/049569 A1 | 4/2011 |
| WO | WO 2011/066029 | 6/2011 |
| WO | WO 2013/006803 A2 | 1/2013 |

OTHER PUBLICATIONS

International Search Report & Written Opinion, PCT/US2015/024532, dated Jun. 5, 2015.
Chemisana et al., "Building Integrated Concentrating Photovoltaics: A Review," Renewable & Sustainable Energy Reviews, vol. 15, No. 1, pp. 603-611 (Jan. 1, 2011).
Horng et al., "Thin Film Soiar Cells Fabricated Using Cross-Shaped Pattern Epilayer Lift-Off Technology for Substrate Recycling Applications," IEEE Transactions on Electron Devices, vol. 59, No. 3, pp. 666-672 (Mar. 2012).
Lee et al., "Epitaxial Lift-off of GaAs Thin-film Solar Cells Followed by Substrate Reuse," 38th IEEE Photovoltaic Specialists Conference (PVSC), pp. 1698-1700 (Jun. 3-8, 2012).
Lee et al., "Multiple Growths of Epitaxial Lift-off Solar Cells From a Single InP Substrate," Appl. Phys. Lett., vol. 97, No. 10, pp. 101107-101109 (Sep. 8, 2010).
Lee et al., "Reuse of GaAs Substrates for Epitaxial Lift-off by Employing Protection Layers," J. Appl. Phys., vol. 111, No. 3, pp. 33527-33532 (Feb. 1, 2012).
Van Geelen et al., "Epitaxial Lift-off GaAs Solar Cell From a Reusable GaAs Substrate," Materials Science and Engineering: B, vol. 45, Nos. 1-3, pp. 162-171 (Mar. 1, 1997).
Van Niftrik et al., "The Influence of $In_xGa_{1-x}As$ and $GaAs_{1-y}P_y$ Layers Surrounding the AlAs Release Layer in the Epitaxial Lift-Off Process," Cryst. Growth Des., vol. 7, No. 12, pp. 2472-2480 (Nov. 17, 2007).

\* cited by examiner

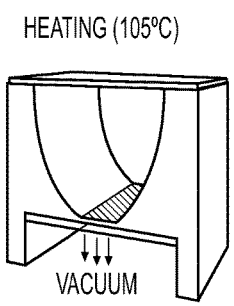
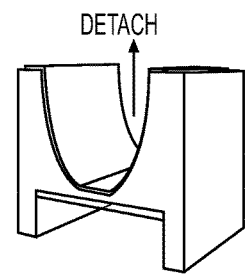
*FIG. 2A*          *FIG. 2B*
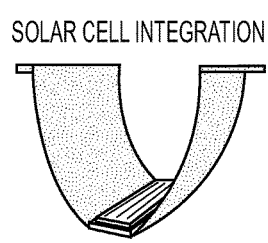
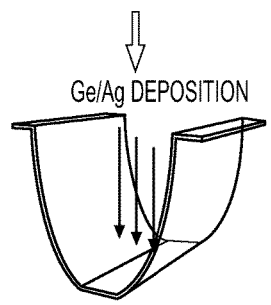
*FIG. 2C*          *FIG. 2D*

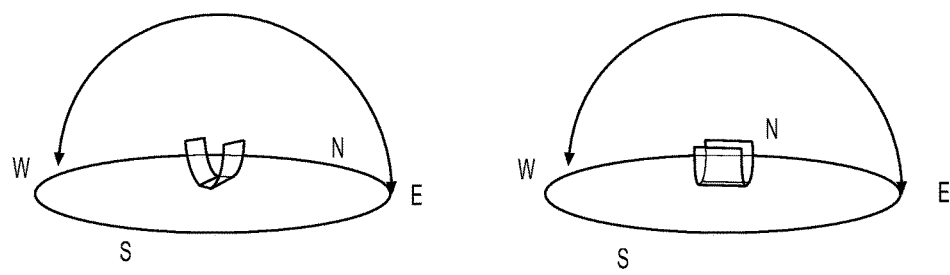
FIG. 6A   FIG. 6B

EPITAXIAL LIFT-OFF PROCESSED GAAS THIN-FILM SOLAR CELLS INTEGRATED WITH NON-TRACKING MINI-COMPOUND PARABOLIC CONCENTRATORS

This application claims priority to U.S. Provisional Application No. 61/975,623, filed on Apr. 4, 2014, which is incorporated herein by reference in its entirety.

JOINT RESEARCH AGREEMENT

The subject matter of the present disclosure was made by, on behalf of, and/or in connection with one or more of the following parties to a joint university-corporation research agreement: The Regents of the University of Michigan and NanoFlex Power Corporation. The agreement was in effect on and before the date the subject matter of the present disclosure was prepared, and was made as a result of activities undertaken within the scope of the agreement.

The present disclosure generally relates to methods and growth structures for making thin-film electronic and optoelectronic devices, such as flexible photovoltaic devices, using epitaxial lift-off (ELO). ELO is a technology in which a thin-film device region may be "lifted off" of a growth substrate or wafer and transferred to a host substrate. The device region is separated from the wafer by selectively etching a sacrificial layer. In particular, the disclosure relates to thin-film ELO cells bonded onto flexible substrates that provide a unique opportunity to integrate the solar collector with the thin-film cell.

ELO has yielded thin single crystalline GaAs solar cells with efficiencies of greater than 28%. While impressive, the process of using chemical etching of a "sacrificial layer" between the cell active layers and the substrate in ELO requires post-treatment of the parent wafer to ready it once more for epitaxial growth of another solar cell active region. For example, to eliminate these defects in preparation for subsequent epitaxial growth, a polishing etch process is typically used. Generally, however, this process does not provide a high quality regrowth interface, and thus device layers grown on a chemically polished surface after ELO lead to subsequently fabricated devices with dramatically reduced performance. Bauhuis, G. J. et al., "Wafer reuse for repeated growth of III-V solar cells," *Prog. Photovolt.* 18, 155-159 (2010). Chemo-mechanical wafer repolishing is used to solve this problem, but such process consumes tens of microns of material from the top surface of the wafer, thereby limiting the potential number of wafer reuses.

Thus, the cost reduction long promised by the ELO process has primarily been limited by the inability to fully recover the original wafer surface quality after each growth leading to a limited number of times the substrate can be recycled due to accumulation of defects, and due to wafer thinning incurred by chemo-mechanical polishing. Considerable efforts in developing photovoltaics have therefore focused on achieving low cost while increasing their power conversion efficiency (PCE). However, high PCE alone does not necessarily translate into low cost solar energy production when expensive active materials and fabrication processes are used in their manufacture.

As an alternative to simply improving the PCE, solar concentrators have been demonstrated as a means for reducing the use of costly active solar cell materials. However, most concentrators suffer from a significant roll-off in efficiency at large light incident angles and can also result in high cell operating temperatures, thereby necessitating expensive active solar tracking and solar cell cooling systems. In view of the foregoing, there is a need to further reduce the production cost by integrating a thin film GaAs solar cell with a low-cost, plastic mini-compound, parabolic concentrator (CPC) by combining the non-destructive ELO (ND-ELO), cold-weld bonding and a vacuum-assisted thermoforming processes.

The inventors have discovered a method of making thin-film GaAs solar cells integrated with low-cost, thermoformed, lightweight and wide acceptance angle mini-CPCs. The fabrication combines rapid ND-ELO thin film cells that can be cold-welded to a foil substrate, and subsequently can be attached to the CPCs in an adhesive-free transfer printing process. The combination of low-temperature operation of the thin-film solar cells along with the highly truncated low-profile plastic CPCs provides 2.8 times enhanced energy harvesting throughout the year without the need for active solar tracking, while eliminating losses incurred at high operating temperatures characteristically encountered in concentration systems.

Thus, there is disclosed a method for integrating a thin-film solar cell with non-tracking mini-concentrators. In an embodiment, the method comprises providing a growth substrate; depositing at least one protection layer on the growth substrate; depositing at least one sacrificial layer on the at least one protection layer; depositing a photoactive cell on the sacrificial layer, wherein the photoactive cell is inverted; and forming a patterned metal layer comprising an array of mesas on the photoactive cells by a photolithography method. After forming the array of mesas, the method comprises bonding the patterned metal layer to a metallized surface of a plastic sheet, and etching the sacrificial layer with one or more etch steps that remove the photoactive cell from the growth substrate to form thin film solar cells. The method then comprises fabricating compound parabolic concentrators from a plastic material using at least one thermoforming process, and transferring the thin film solar cells onto the thermoformed compound parabolic concentrators by an adhesive-free bonding step to form an integrated thin-film solar cell and compound parabolic concentrator.

The inventors have also discovered an improved photovoltaic device comprising a thin-film solar integrated with non-tracking mini-compound parabolic concentrators made from the disclosed method. For example, the photovoltaic device comprises a thin-film solar cell bonded to a plastic compound parabolic concentrator, wherein the plastic compound parabolic concentrator comprise two parabolas tilted at an angle equal to the acceptance angle of the compound parabolic concentrator. In this embodiment, the solar cell is able to collect light at angles broader than the acceptance angle of the compound parabolic concentrator.

Aside from the subject matter discussed above, the present disclosure includes a number of other exemplary features such as those explained hereinafter. It is to be understood that both the foregoing description and the following description are exemplary only.

BRIEF DESCRIPTION OF THE DRAWINGS

The accompanying figures are incorporated in, and constitute a part of this specification.

FIG. 2 is a schematic illustration of a fabrication flow for the plastic mini-CPC via vacuum-assisted thermoforming technique.

FIG. 6 is a schematic illustration of two different cylindrical CPC alignments along a solar path showing 4(a) north-south axis alignment and 4(b) east-west axis alignment.

FIG. 12(a) showing polar plots showing coverage of CPC at its optimum seasonal positions; FIG. 12(b) showing contour plot of daily and hourly concentration factors in Phoenix, Ariz. using a 6° tilted CPC; and FIG. 12(c) showing the ratio of the daily concentrated energy harvesting factor for the thin-film GaAs solar cells with the 6° tilted CPC compared to a cell without concentration.

DETAILED DESCRIPTION

Definitions

Figure 1A:
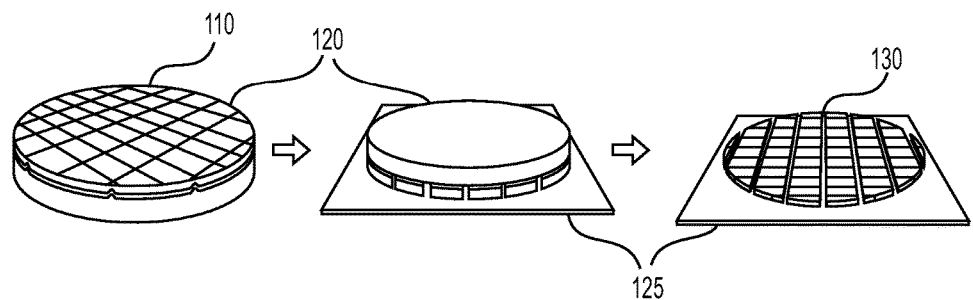
FIGS. 1(a) to 1(c) are schematic illustrations of fabrication flow for pre-mesa patterning, cold welding and ELO process.

As used herein, the term "acceptance angle" is the maximum angle at which incoming sunlight can be captured by a solar concentrator, such as a compound parabolic concentrator.

As used herein, the term "III-V material," may be used to refer to compound crystals containing elements from group IIIA and group VA of the periodic table. More specifically, the term "III-V material" may be used herein to refer to compounds which are combinations of the group of Gallium (Ga), Indium (In) and Aluminum (Al), and the group of Arsenic (As), Phosphorous (P), Nitrogen (N), and Antimony (Sb).

It should be noted that the III-V compounds herein are named in an abbreviated format. A two component material is considered to be in approximately a 1:1 molar ratio of group III:V compounds. In a three or more component system (e.g. InGaAlAsP), the sum of the group III species (i.e. In, Ga, and Al) is approximately 1 and the sum of the group V components (i.e. As, and P) is approximately 1, and thus the ratio of group III to group V is approximately unity.

Names of III-V compounds are assumed to be in the stoichiometric ratio needed to achieve lattice matching or lattice mismatching (strain), as inferred from the surrounding text. Additionally, names can be transposed to some degree. For example, AlGaAs and GaAlAs are the same material.

As used and depicted herein, a "layer" refers to a member or component of a device whose primary dimension is X-Y, i.e., along its length and width. It should be understood that the term layer is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

When a first layer is described as disposed or deposited "over" or "above" a second layer, the first layer is positioned further away from the substrate than the second layer. The first layer may be disposed directly on the second layer, but unless it is specified that the first layer is disposed or deposited "on" or "in physical contact with" the second layer, there may be other layers between the first layer and the second layer. For example, an epilayer may be described as disposed "over" or "above" a sacrificial layer, even though there may be various layers in between. Similarly, a protection layer may be described as disposed "over" or "above" a growth substrate, even though there may be various layers in between. Similarly, when a first layer is described as disposed or deposited "between" a second layer and a third layer, there may be other layers between the first layer and the second layer, and/or the first layer and the third layer, unless it is specified that the first layer is disposed or deposited "on" or "in physical contact with" the second and/or third layers.

As used herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

As used herein, the terms "wafer" and "growth substrate" can be used interchangeably.

As used herein the term "etchant selectivity" refers to the rate at which a particular etchant removes a particular material when compared to the rate of etching of another material. Etchant selectivity of X and Y is quantified as the ratio between the etching rate of X to the etching rate of Y for a particular etchant. Accordingly, "highly selective," as used herein, refers to instances where one material is etched rapidly while the other is etched very slowly or not etched at all, such as greater than 10:1, or 100:1, or 1000:1, 10,000:1 or greater.

Compared to elemental semiconductors such as Si or Ge, compound semiconductors often have superior properties useful in high efficiency solar cells. However, wafers on which active device regions are grown are prohibitively costly, limiting their use for practical solar cells. As a result ELO, whereby III-V semiconductor solar cells are removed from the substrate by selectively etching away an AlAs "sacrificial layer" between the wafer and the cell epi (also referred to as photoactive cell), are described herein to reduce costs by allowing for wafer reuse.

The non-destructive substrate reuse method without performance degradation described herein provides the potential for dramatic production cost reduction. In addition, the disclosed method extends the application of high performance group III-V optoelectronic devices by moving from bulky, two dimensional substrate-based platforms to conformal, flexible and light weight thin-film devices. Moreover, direct integration of thin-film solar cells with low cost concentrators, such as plastic parabolic concentrators, can further reduce the cost for solar to electrical energy conversion.

As shown herein, the integration of thin-film GaAs solar cells produced by an accelerated ND-ELO fabrication process, and integrated with simple, thermoformed mini-concentrators can lead to dramatic reductions in the cost of the production of electricity via solar energy harvesting. This approach reduces cell materials and fabrication costs to a minimal level, such as about 3% of that of analogous substrate-based GaAs cells, and only 11% of ELO-processed GaAs solar cells, while the optical system maximizes the annual energy output without requiring daily active solar tracking systems by using highly-truncated two dimensional mini-compound parabolic concentrators (CPCs).

The low-profile concentrator described herein provides a thin and lightweight module with improved off-angle sunlight absorption compared to conventional concentrators both in direct, as well as diffuse sunlight with only minor losses. The disclosed approach eliminates the need for high concentration factor optics that require expensive and heavy solar tracking paraphernalia. Furthermore, the unique geometry of the disclosed thin-film GaAs solar cells that are mounted on a heat-sinking metal layer enable operation at or near room temperature without active cooling, even for concentration factors approaching 4×, representing a reduction of over 40° C. when compared to substrate-based GaAs solar cells.

Thin-Film Inorganic Solar Cell Fabrication

There is disclosed a non-destructive ELO (ND-ELO) process that eliminates wafer damage by employing surface protecting layers interposed between the wafer and the epitaxial structure, which consists of multilayer structure, including sequential protection, sacrificial and active device layers. The protection layers comprise protection and buffer layers, which are generally lattice matched layers having a thickness ranging from 5 to 200 nm, such as 10 to 150 nm, or even 20 to 100 nm. These layers are generally grown by gas source, such as gas source molecular beam epitaxy (GSMBE). Other suitable deposition techniques for preparing the growth structure include, but are not limited to, metallo-organic chemical vapor deposition (MOCVD), hydride vapor phase epitaxy (HVPE), solid source molecular beam epitaxy (SSMBE), and chemical beam epitaxy.

In one embodiment, the substrate may comprise GaAs, and the substrate protective layers and device structure protective layers may be lattice matched compounds, such as AlAs, GaAs, AlInP, GaInP, AlGaAs, GaPSb, AlPSb and combinations thereof. In another embodiment, the substrate may comprise GaAs and the substrate protective layers and device structure protective layers may be strained layers, such as InP, InGaAs, InAlAs, AlInP, GaInP, InAs, InSb, GaP, AlP, GaSb, AlSb and combinations thereof, including combinations with lattice matched compounds.

Examples of suitable III-V materials for the one or more protective layers include, but are not limited to, AlInP, GaInP, AlGaAs, GaPSb, AlPSb, InP, InGaAs, InAs, InSb, GaP, AlP, GaSb, AlSb, InAlAs, GaAsSb, AlAsSb, and GaAs. In some embodiments, when the growth substrate is GaAs, the one or more protective layers are chosen from lattice matched AlInP, GaInP, AlGaAs, GaPSb, AlPSb, and strained InP, InGaAs, AlInP, GaInP, InAs, InSb, GaP, AlP, GaSb, AlSb. In some embodiments, when the growth substrate is InP, the one or more protective layers are chosen from lattice matched InGaAs, InAlAs, GaAsSb, AlAsSb, and strained InGaAs, InAlAs, GaAsSb, AlAsSb, InAs, GaSb, AlSb, GaAs, GaP and AlP. U.S. Pat. No. 8,378,385 and U.S. Patent Publication No. 2013/0043214 are incorporated herein by reference for their disclosure of protective layer schemes.

The protection layer may further comprise one or more protective layers, as described. In some embodiments, the protection layer further comprises one protective layer. In other embodiments, the protection layer further comprises two protective layers. In other embodiments, the protection layer further comprises three or more protective layers. The protective layer(s) may be positioned between the growth substrate and the sacrificial layer.

A sacrificial release layer is then grown onto the protection layers. One non-limiting example of such a layer is AlAs. When using this material as a sacrificial layer, arsenic oxide buildup can slow the AlAs etch during lift-off. Thus, by cladding the Al(Ga)As with a slowly etched III-V material (e.g. InAlP, AlGaAs, InAlGaP) the arsenic oxide buildup can be reduced; thus, expediting the lift-off process. U.S. Patent Publication No. 2010/0047959, which is incorporated herein by reference, describes a method for selectively freeing an epitaxial layer from a single crystal substrate.

In one embodiment, the active thin-film device region can be lifted-off by selectively etching a sacrificial layer using a known acid. The sacrificial layer of the growth structure acts as a release layer during ELO for releasing the epilayer from the growth substrate. The sacrificial layer may be chosen to have a high etch selectivity relative to the epilayer and/or the growth substrate so as to minimize or eliminate the potential to damage the epilayer and/or growth substrate during ELO. It is also possible to use protective layers between the sacrificial layer and the epilayer to protect the epilayer during ELO. In some embodiments, the sacrificial layer comprises a III-V material. In some embodiments, the III-V material is chosen from AlAs, AlGaAs, AlInP, and AlGaInP. In certain embodiments, the sacrificial layer comprises Al(Ga)As. In some embodiments, the sacrificial layer has a thickness in a range from about 2 nm to about 200 nm, such as from about 4 nm to about 100 nm, from about 4 nm to about 80 nm, or from about 4 nm to about 25 nm.

The step of releasing the sacrificial layer by etching may be combined with other techniques, for example, spalling. PCT Patent Application No. PCT/US14/52642 is incorporated herein by reference for its disclosure of releasing an epilayer via combination of etching and spalling.

Next, the epilayer (or active device region) is grown, typically in inverted order such that after bonding to the secondary plastic substrate, devices can be fabricated in their conventional orientation, thereby eliminating a second transfer step often employed in ELO device processing. The epilayer of the growth structure refers any number of layers desired to be "lifted off" of the growth substrate. The epilayer, for example, may comprise any number of active semiconductor layers for fabricating an electronic or optoelectronic device. Thus, the epilayer is sometimes referred to as a "active device region." The epilayer may comprise layers for fabricating devices including, but not limited to, photovoltaics, photodiodes, light-emitting diodes, and field effect transistors, such as metal-semiconductor field-effecttransistors and high-electron-mobility transistors. In some embodiments, the epilayer comprises at least one III-V material.

In one embodiment, after the substrate is bonded to the plastic substrate, the active device region may be lifted-off from the parent wafer by immersion etching, such as with an acid.

In one embodiment, the photovoltaic cell comprises an active photovoltaic region comprising a flexible crystalline semiconducting cell. Non-limiting examples of the single junction semiconducting cell includes InGaP, GaAs, InGaAs, InP, or InAlP. The flexible crystalline semiconducting cell typically has a thickness ranging from 2 to 10 µm, such as from 3-6 µm.

In another embodiment, the photovoltaic cell comprising an active photovoltaic region comprising multi-junctions cells, such as tandem photovoltaic (with two sub-cells), triple junction cells (three sub-cells), or even quad junction cells (four sub-cells).

After the photovoltaic cell is formed, it is coated with a conductive metal coating on one surface. Non-limiting examples of the metal coating includes at least one metal chosen from Au, Ag, Pt, Pd, Ni, and Cu, with a particular emphasis on Au. In one embodiment, the Au layer on the support substrate has a thickness ranging from 100-500 nm, such as from 200-400 nm.

Once the photovoltaic cell is removed from the growth substrate by the non-destruction ELO process described above, it is mounted on the support structure by various bonding process. For example, the active photovoltaic region, whether single junction or multi-junction cells, may be applied to the host substrate by a direct-attachment bonding process. This process comprises adding metal layers to adjoining surfaces of the active region and the flexible host substrate and using cold-welding to bond them. Cold-weld bonding processes typically include pressing two surfaces together at room temperature to achieve a uniformly bonded interface.

Alternative direct-attachment bonding processes may include thermo-compression bonding, which typically involves the application of a lower pressure but at a high temperature (i.e., higher than the metal re-crystallization temperature). This process is typically not used when the flexible substrate has a glass transition and/or a melting temperature below the re-crystallization temperature of metal layers used in direct-attachment bonding processes.

Another direct-attachment technique for bonding metal layers associated with an ELO process that may be used is a thermally-assisted cold-weld bonding process using a lower pressure than typical cold-welding processes and a lower temperature than typical thermo-compression bonding processes. Particularly, thermally-assisted cold-welding may reduce the likelihood of damaging semiconductor wafers, thereby increasing the reuse rate of the wafers for growing additional active regions.

Non-limiting examples of the direct-attachment bonding processes that can be used herein include cold-welding, thermally assisted cold-welding, or thermo-compression bonding. U.S. Patent Application Publication No. US 2013/0037095, which describes cold-welding, is incorporated herein by reference.

In one embodiment, there is disclosed an accelerated ND-ELO process that employs laser dicing. For example, FIG. 1 shows the fabrication sequence of the thin-film GaAs solar cells via the combination of rapid ND-ELO and cold-weld bonding, according to one aspect of the present disclosure. Known ND-ELO methods typically employ epitaxial protection layers grown between the sacrificial layer and the wafer that completely preserves the original wafer surface quality, even at the atomic scale, during the ELO process.

Selective removal of protection layers using wet chemical etching eliminates the need for chemo-mechanical polishing used in conventional ELO. Therefore, ND-ELO allows for the nearly indefinite reuse of the GaAs substrates, converting their cost from a materials expense into a capital investment. However, the process is time-consuming. To accelerate conventional ELO that takes several hours to separate the active epitaxy from even a small wafer, a thick metal layer, such as a layer greater than 100 nm, such as 200 nm to 500 nm, such as a 350 nm thick Au layer, may be deposited onto the epitaxial layer surface. The metal layer is photo-lithographically patterned to form a mask for the formation of an array of mesas separated by defined trenches, such as 100 µm to 500 µm wide trenches by wet chemical etching that terminates at the active solar cell epitaxy/AlAs sacrificial layer interface.

FIG. 1 illustrates the fabrication steps for integration of CPCs with thin-film GaAs solar cells. FIG. 1(a) shows (from left to right): Mesas (110) that have been pre-patterned prior to non-destructive epitaxial lift-off (ND-ELO) by selective etching that stops at the AlAs sacrificial layer (120). The sample is then bonded onto the Au coated Kapton® sheet (125) via cold-welding. The third step shows the sample (130) following ND-ELO.

Figure 1B:
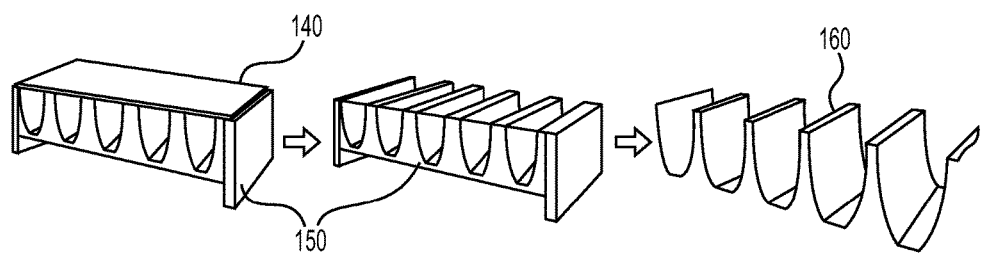

FIG. 1(b) illustrates the thermoforming process used in fabricating the mini-CPCs according to one aspect of the present disclosure. Here it shows that the process employs three molds: a metal mold to shape the thermoformed CPC, another for making an elastomeric stamp to transfer the solar cells onto the substrate, and a third to assist in solar cell alignment. With further reference to FIG. 1(b), a PETG sheet (140) is shown to be fixed on top of the metal mold (150). Then the PETG is thermoformed into its final shape by applying heat and vacuum. Finally, the mini-CPCs are detached from the mold (160).

Figure 1C:
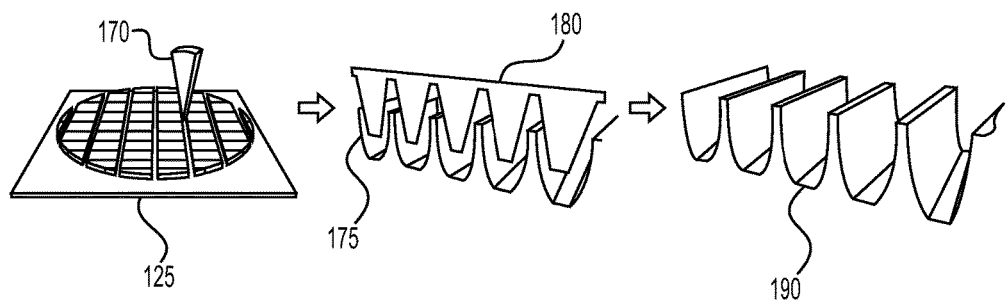

FIG. 1(c) shows a solar cell-Kapton® sheet assembly that is separated into individual bars using laser dicing (170). For example, in one embodiment, a $CO_2$ laser engraving and cutting system (X-660 superspeed-600, Universal Laser Systems, Inc.) can be used to dice the non-destructive epitaxial lift-off (ND-ELO) processed thin-film GaAs solar cells bonded to a Kapton® sheet (125). Then, each bar is transfer printed onto the mini-CPCs (175) using a PDMS stamp (180) via low-pressure cold-welding. The last schematic shows the integrated thin film solar cells and mini-CPC after reflective metal coating is deposited onto the CPC array surface (190).

With additional reference to FIG. 1(c), an embodiment is shown of a self-aligned transfer printing for thin-film GaAs solar cells onto plastic CPCs that can be used according to an embodiment. In this embodiment, an acrylonitrile butadiene styrene (ABS) mold for an polydimethylsiloxane (PDMS) stamp (180) can be used to integrate and align the thin-film GaAs solar cells with plastic mini-CPCs is fabricated using a 3D printer (Dimension Elite, Stratasys).

FIG. 2 provides additional information of the fabrication process used to fabricate the parabolic concentrator array shown and described in FIG. 1(b). Here, a deformable medium (e.g. polymer) can be molded to cylindrical paraboloids mini-concentrator using a vacuum mold and oven. The entire molded array of this embodiment can be extremely lightweight (as it can be made entirely comprised of plastic and thin metal films) and have some limited flexibility when complete. With the reflective surface facing up, the concentrator is designed such that the line of focal point is located right at the center of the concentrator opening plane, which allows the full collection of light incident into the cylindrical paraboloids mini-concentrator.

With reference to FIG. 2(a), the thermoforming process may comprise heating a PETG sheet to 105° C. while a vacuum is used to pull the PETG to the shape of the mold. After the CPC is thermoformed into its final shape by applying heat and vacuum, it can be detached from the mold, as shown in FIG. 2(b). Next, the solar cells are integrated into the detached CPC by transfer printing onto the mini-CPCs. As described in FIG. 1(c), solar cell integration may be accomplished using a PDMS stamp (180) via low-pressure cold-welding. FIG. 2(d) shows the integrated thin film solar cells and mini-CPC after reflective metal coating is deposited onto the CPC array surface (190).

Figure 3A:
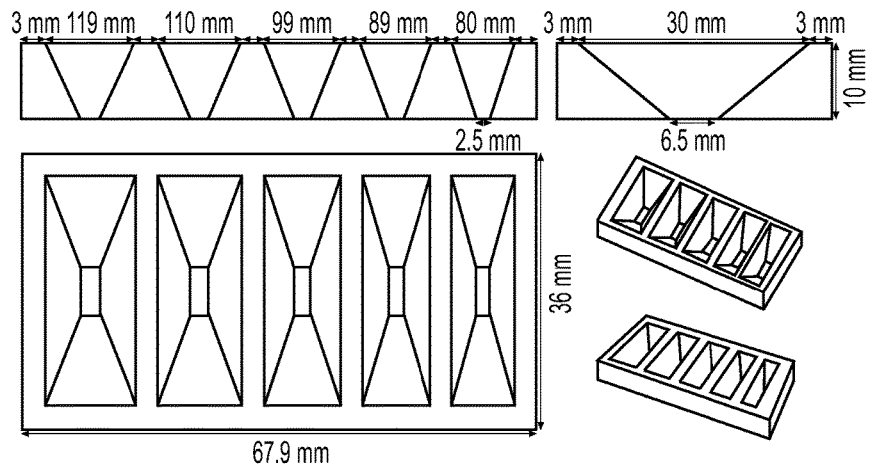
FIGS. 3(a) to 3(c) are schematic illustrations showing various aspects of the self-aligned transfer printing process that can be used in the present disclosure.
Figure 3B:
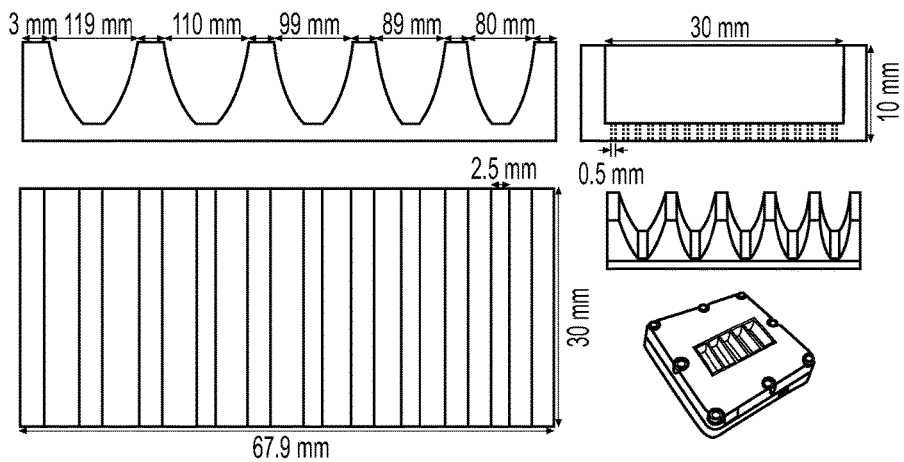
Figure 3C:
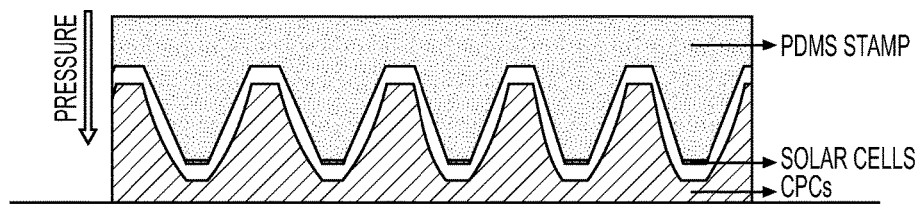

FIG. 3(a) shows the detailed dimensions and photographs of the mold for the PDMS stamp, which is designed to exactly fit into the CPC opening shown in FIG. 3(b). An additional 3D printed mold may be used to align the solar cell strips for pick-up by the PDMS stamp. The pyramid shape of the PDMS stamp prevents direct contact between the stamp and the side walls of the CPC so that pressure for bonding the solar cells is only applied onto the CPC base. FIG. 3(c) is a schematic of the fit between the stamps and CPCs.

Mini-Compound Parabolic Concentrator (CPC) Design

The CPCs described herein may be fabricated from a flexible material comprises, including a plastic material, such as a polyimide, or metal foil. The support structure typically has a thickness ranging from 25 to 100 µm, such as 40 to 60 µm. When the flexible material comprises a plastic material, it typically has a conductive metal coating on one surface. Non-limiting examples of the metal coating includes at least one metal chosen from Au, Ag, Pt, Pd, Ni, and Cu, with a particular emphasis on Au. In one embodiment, the Au layer on the support substrate has a thickness ranging from 100-500 nm, such as from 200-400 nm.

Figure 5B:
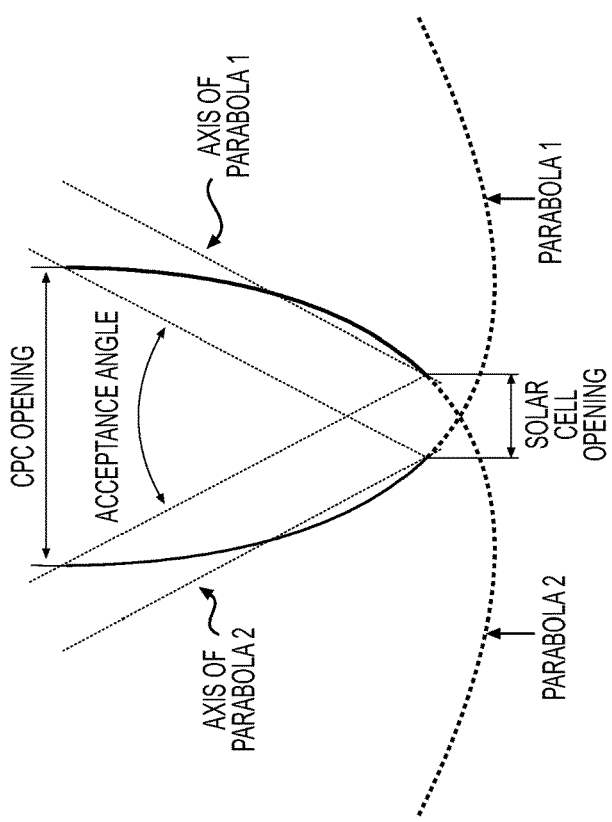
FIGS. 5(a) to 5(e) describe two dimensional mini-CPC designs according to the present disclosure.
Figure 5A:
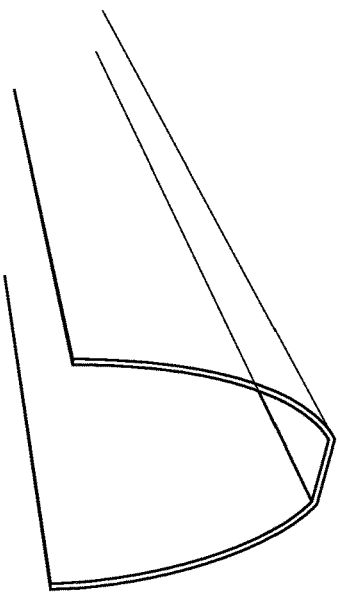

FIGS. 5(a) and 5(b) show schematics for a CPC comprised of two parabolas with tilted axes at an angle equal to its acceptance angle. The plastic mini-CPCs are 2D, half cylinders to eliminate the need for solar tracking along its longitudinal axis. FIG. 5(c) shows the effect of CPC truncation on the acceptance angle and concentration factor, CF. A non-truncated CPC shows the highest CF with no light collection outside of the acceptance angle. Although the CF is reduced with increased truncation, it is nevertheless able to collect light at much broader angles than the acceptance angle.

Ray tracing using Matlab software (MathWorks) was used to determine the CF. The geometry of the CPC defined in Cartesian coordinates, and its four vertices were calculated using base width (defined by the dimensions of the GaAs solar cell), height, and acceptance angle. Note that the focal points of the two parabolas comprising the CPC form the base edges. Practical CPC heights (~8% of the untruncated CPC), were chosen where truncation alters the acceptance of input rays incident on CPC, and hence the CF. It was assumed that the input rays were parallel.

Now, CF is the ratio of photons incident on solar cell with CPC, to that without it. Due to the symmetry of the CPC about its central axis, only positive solar incident angles were considered, i.e., $0 < \theta_{sun} < \theta_{max}$, where $\theta_{sun}$ is the angle of the rays with respect to the central axis of CPC, and $\theta_{max}$ is the angle at which all incident rays are shadowed and thus, CF→0. Greater than 10,000 spatially distributed rays for each angle were used. When a ray is reflected by the CPC, its intensity is reduced by the reflectance of Ag, which was measured on PETG using a variable-angle spectroscopic ellipsometer (VASE, J. A. Woollam) and a UV/Vis/NIR Spectrophotometer (LAMBDA 1050, Perkin Elmer). The range of wavelengths and angles was 300 nm to 900 nm with 3 nm steps, and from 15° to 85° with 5° steps. The values between those measured are interpolated. Then, the wavelength and incident angle dependent reflectance is weighted by the AM1.5G solar spectrum. Finally, CF vs. $\theta_{sun}$ and acceptance angle is calculated.

Figure 5D:
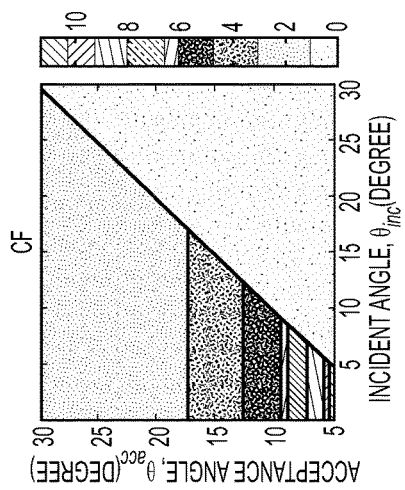
Figure 5E:
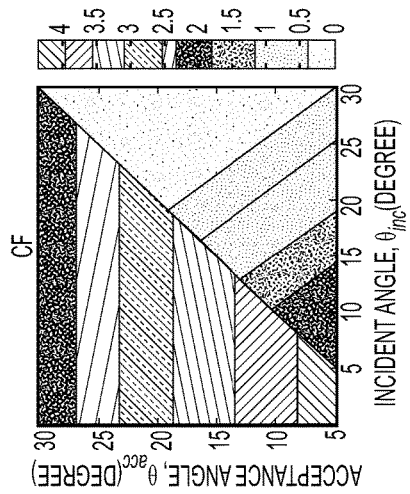
Figure 5C:
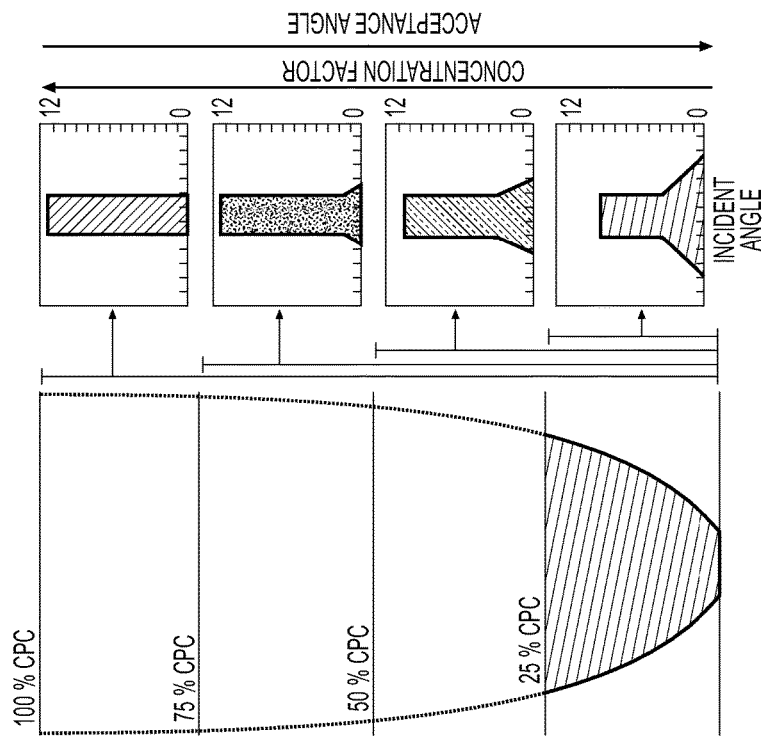

FIGS. 5(d) and (e) show contour plots of CF vs. incident angle calculated for various CPC shapes. FIG. 5(d) shows the case of a non-truncated CPC where CF increases as the angle between each parabola axis (i.e. the acceptance angle) decreases. FIG. 5(e) shows the case of CPCs with a fixed aspect ratio of 4 (solar cell width/CPC height/solar cell width) such that the truncation ratio depends on acceptance angle. The truncation ratios of CPCs with narrow acceptance angles are higher than for wide acceptance angles.

In one embodiment, the CPC comprises a cylindrical symmetry. In this embodiment, the acceptance angle of the concentrator is limited to only single axis. FIG. 6 shows two different alignment geometries that can be achieved by the mini-CPC cylinder. FIGS. 6(a) and 6(b) exhibit the CPC longitudinal axis aligned with the north-south axis and the east-west axis, respectively. In the case of the north-south alignment without tracking, the CPC only collects sunlight during the time of day where the sun lies within the 40° acceptance angle of the CPC; however, the east-west axis alignment provides a wide coverage of sunlight during the day, even without tracking, by tilting toward the solar declination path. The position of the CPC needs to be adjusted only 4 times per year for optimum energy harvesting since the acceptance angle of the CPC is sufficiently wide to cover the seasonal changes in the solar path.

Figure 7A:
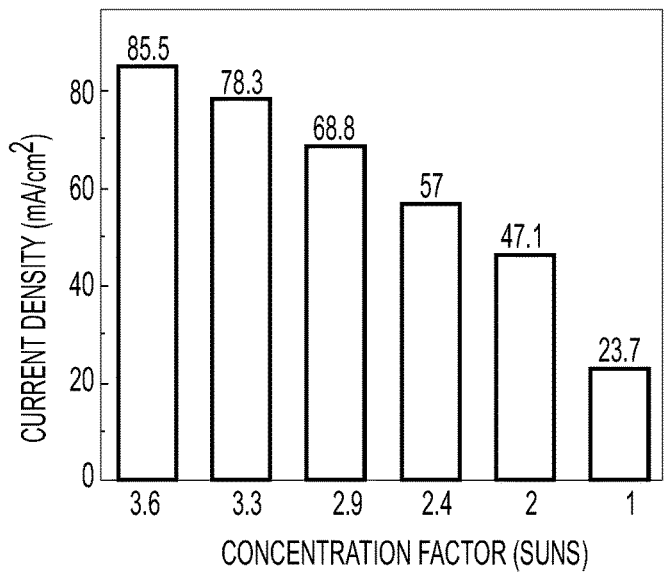
FIGS. 7(a) to 7(d) show performance of a thin-film GaAs solar cells under the concentrated light.
Figure 7B:
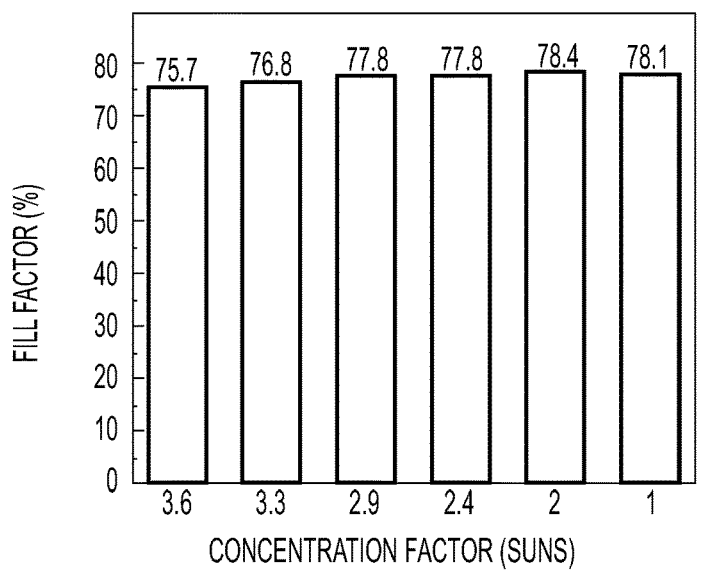
Figure 7C:
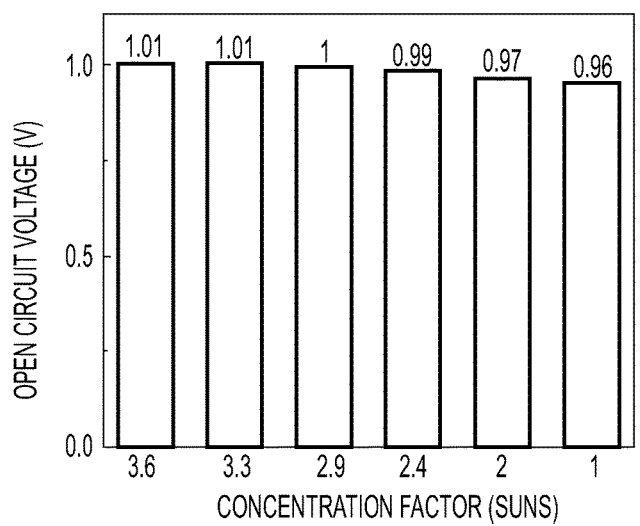
Figure 7D:
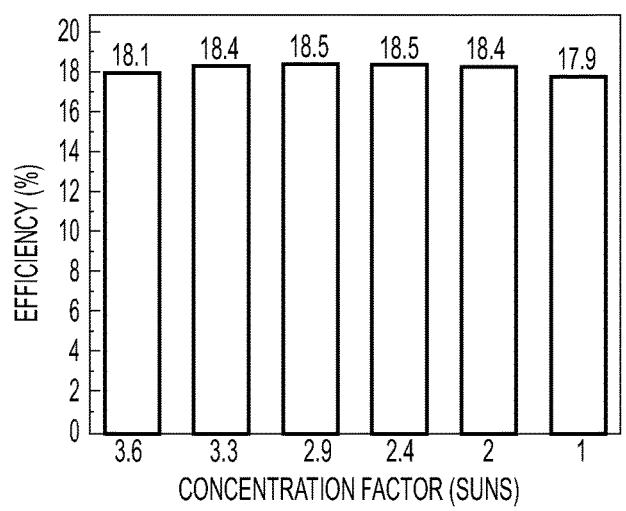

Characteristics of thin-film GaAs solar cells made according to the present disclosure and measured under the concentrated light are described as follows. FIGS. 7(a) to 7(d) show performance of a thin-film GaAs solar cells under the concentrated light. FIG. 7(a) shows short circuit current. FIG. 7(b) shows fill factor. FIG. 7(c) shows open circuit voltage, and FIG. 7(d) shows power conversion efficiency of the thin-film GaAs solar cells under the various concentrated light conditions measured by their integration with the mini-CPCs.

With reference to FIGS. 7(a) to 7(d), the solar cells are integrated with the mini-CPCs as previously described, and are measured using a solar simulator calibrated to AM 1.5G illumination at 1 sun (100 mW/cm2) using a Si photodiode. Short circuit current (Jsc), Open circuit voltage (Voc), fill factor, and power conversion efficiency (PCE) are extracted from the I-V characteristics. The measurement shows the power conversion efficiency of the cell integrated with a 6° tilted CPC with CF=3.3 is slightly improved (~0.5%) compared to a non-concentrated device with one due to the increased open circuit voltage, Voc, at higher intensities.

Figure 8:
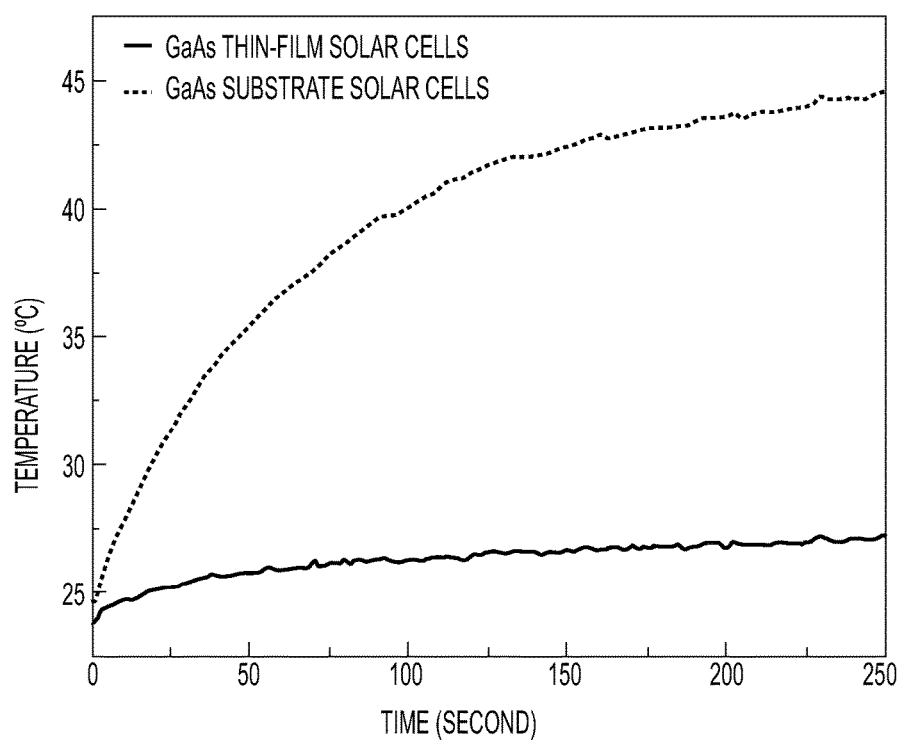
FIG. 8 shows operating temperature of the thin-film and the substrate GaAs solar cells. Time dependent temperature measured by IR imaging under 1 sun illumination (100 mW/cm$^2$).

A comparison of solar cell operation temperature under 1 sun illumination is provided in FIG. 8, which shows the operating temperatures of thin-film and substrate-based GaAs solar cells under simulated AM 1.5G, 1 sun intensity (100 mW/cm$^2$) illumination. After 250 s, the substrate-based GaAs solar cells operate around 45° C. as predicted, whereas the thin-film cells operate at a much lower 28° C.

Figure 10A:
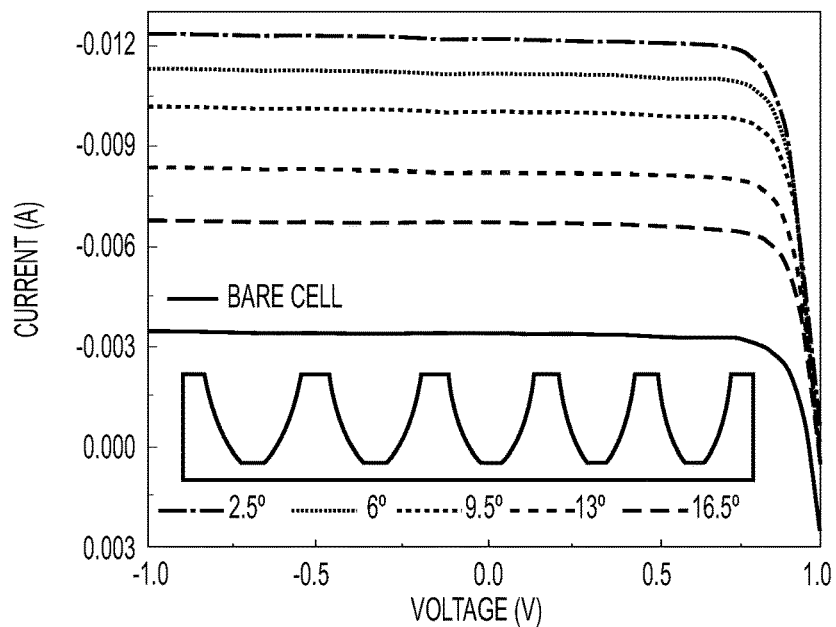
FIGS. 10(a) to 10(d) show performance characteristics of solar cells made according to the present disclosure.
Figure 10B:
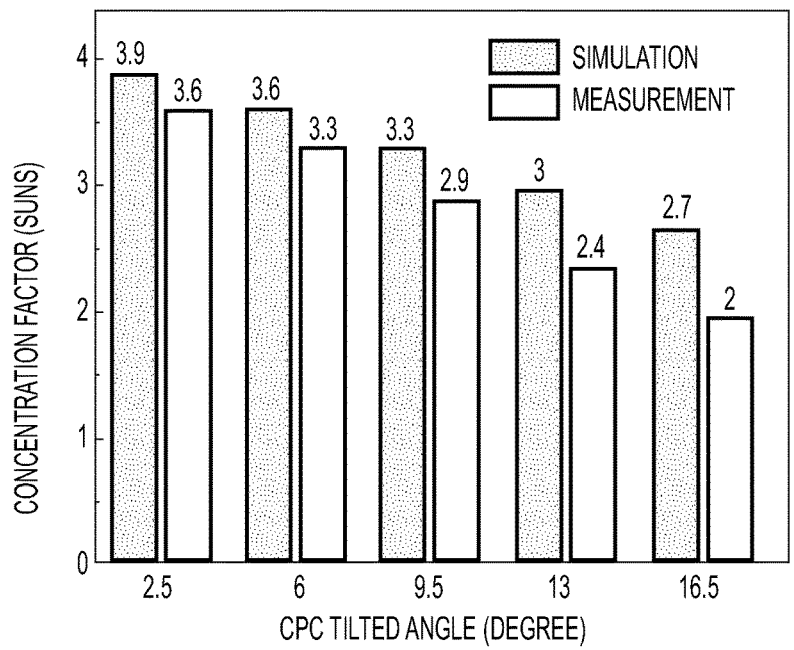
Figure 10C:
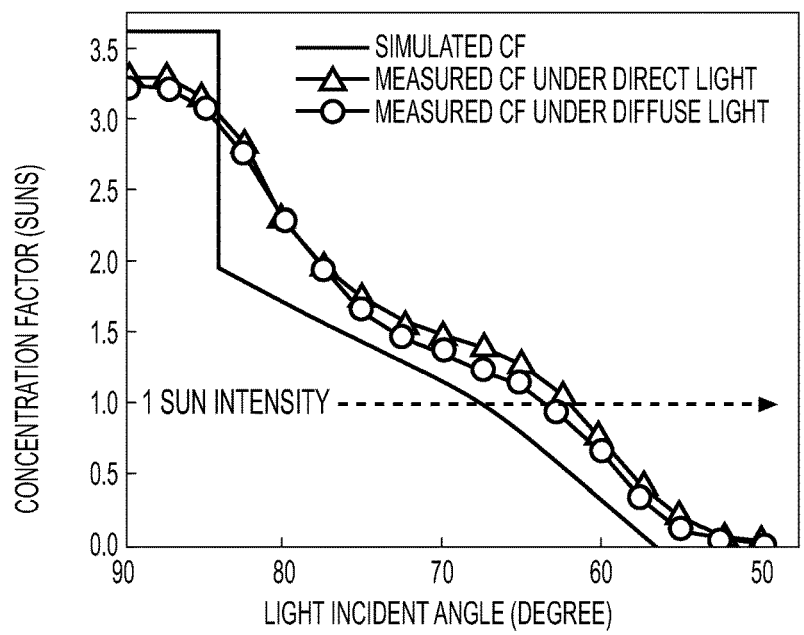
Figure 10D:
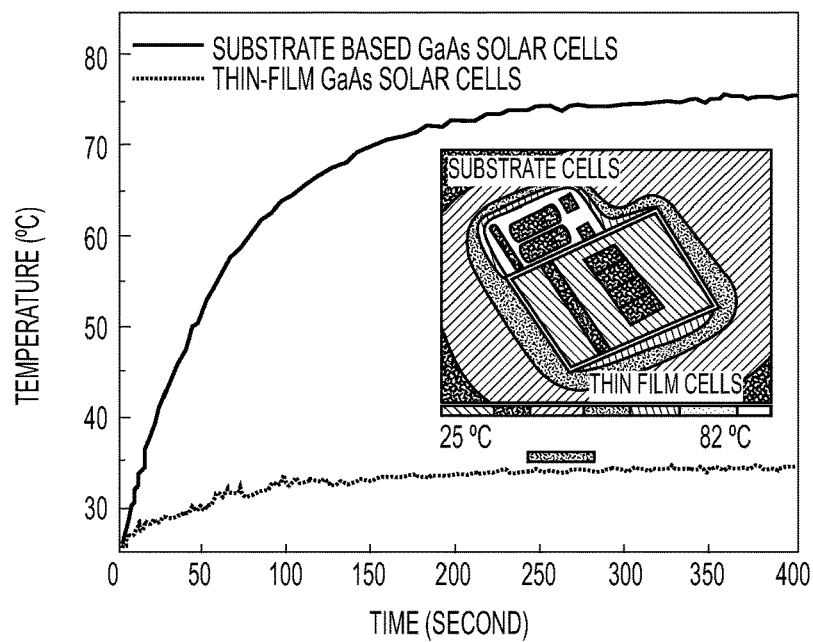

FIG. 10(a) shows the current-voltage (I-V) characteristics of the thin-film GaAs solar cells measured under simulated AM 1.5G illumination at 1 sun (100 mW/cm$^2$) intensity;

FIG. 10(b) shows the dependence of the concentration factor on the tilt angles of the axes of the parabolas as inferred from the I-V characteristics along with the calculated values; FIG. 10(c) shows both the measured and calculated values of the concentration factor as functions of the solar incidence angle for the 92% height-truncated, 6° tilted CPC under both direct and diffuse illumination; FIG. 10(d) shows the thermal performance of both substrate-based and thin film GaAs solar cells under 3.3 suns concentration.

Figure 11A:
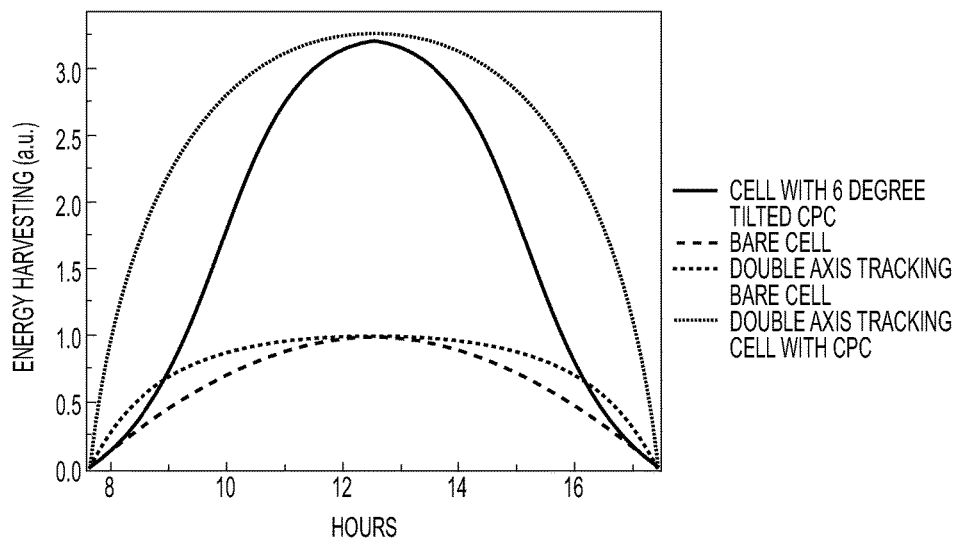
FIGS. 11(a) to 11(d) show characterization of hourly and annual energy harvesting using CPCs according to the present disclosure.
Figure 11B:
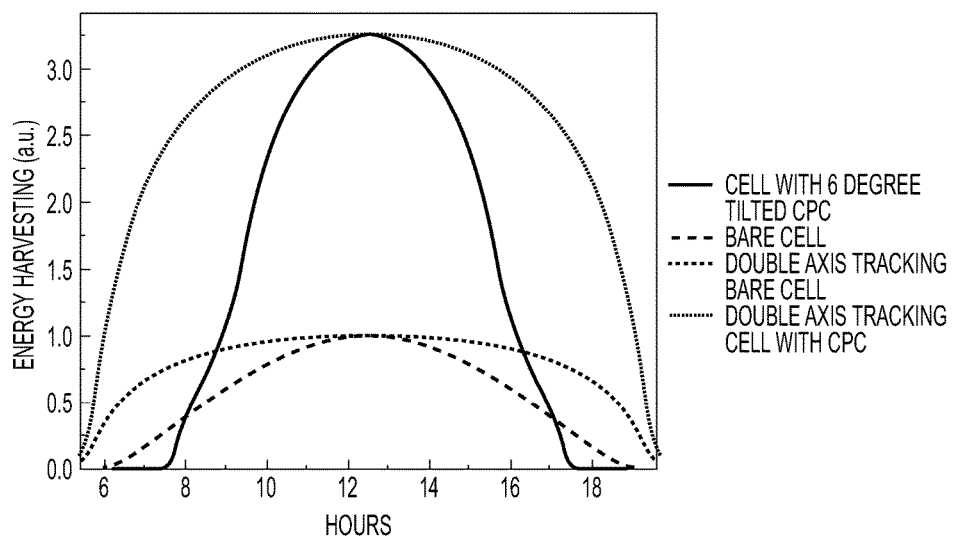
Figure 11C:
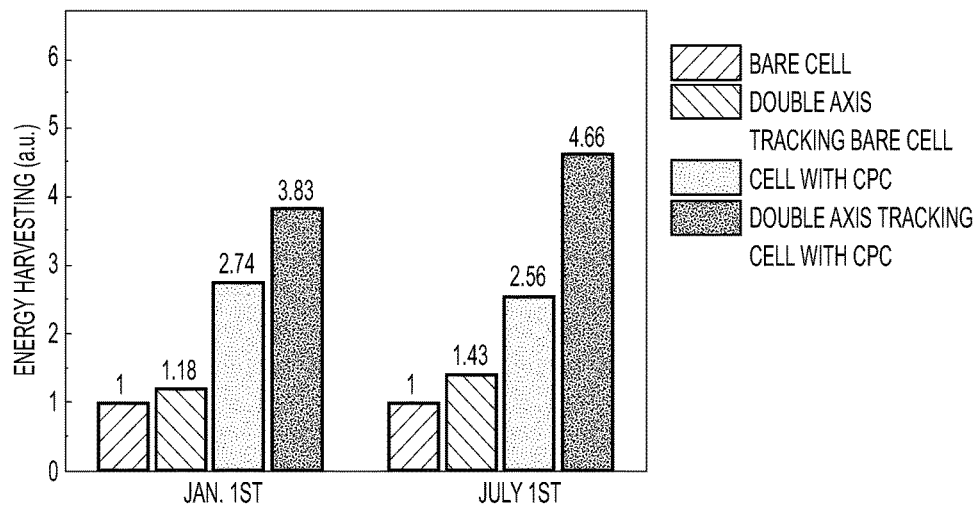
Figure 11D:
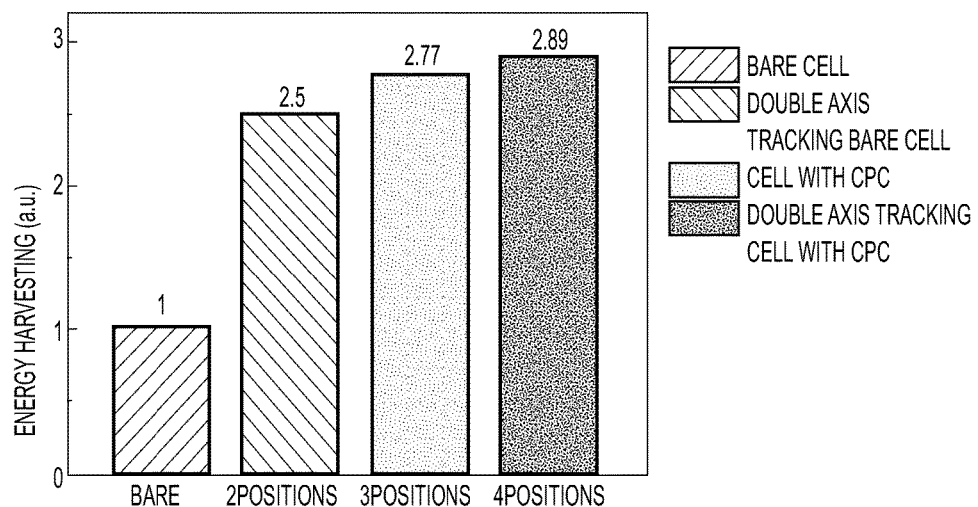

FIGS. 11(a) and 11(b) show the energy harvesting on two specific dates during winter and summer, respectively, using a 6° tilted CPC. The wide acceptance angle enables the CPC to cover most of the useful daylight with low air mass. From the integration of hourly energy harvesting curves for thin-film GaAs solar cells with and without a CPC, we confirm that the ND-ELO processed solar cells integrated with a 6° tilted CPC shows 2.8 and 2.7 times higher energy harvesting compared with non-concentrated cells on January $1^{st}$ and July $1^{st}$, respectively (FIG. 11(c) and FIG. 11(d)) compares the non-concentrated, and the 2, 3 and 4 tilt positions per year.

Figure 12A:
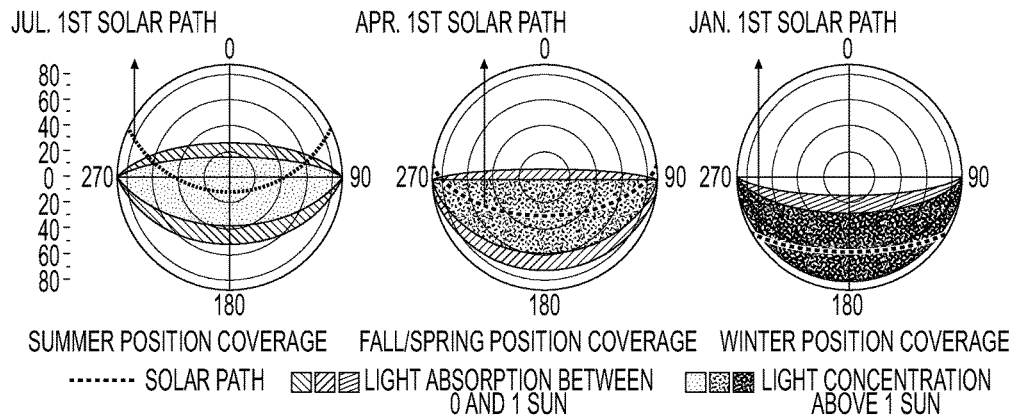
FIGS. 12(a) to 12(c) show optimum alignment of CPCs for maximum annual energy harvesting, including.

One benefit associated with the CPC/thin-film GaAs solar cell assemblies described herein is their enhanced annual energy harvesting characteristics. As described, the mini-CPC according to the present disclosure is cylindrically symmetric, suggesting that enhanced energy harvesting when aligned along an east-west axis. This alignment will provide the widest coverage of sunlight throughout the day simply by tilting its axis towards the zenith of solar declination path, with only occasional seasonal adjustments in tilt. In one embodiment, the seasonal alignments in Phoenix, Ariz. (33.4N, 112.1W) are provided in FIG. 12(a). This shows the solar path at specific dates (January 1, April 1, and July 1) and the coverage of the 6° tilted CPC at seasonally adjusted tilt angles, such as adjusted to zenith angles of 11°/31°/53.5° only at the summer solstice, spring/fall equinoxes, and the winter solstice, respectively.

Figure 12B:
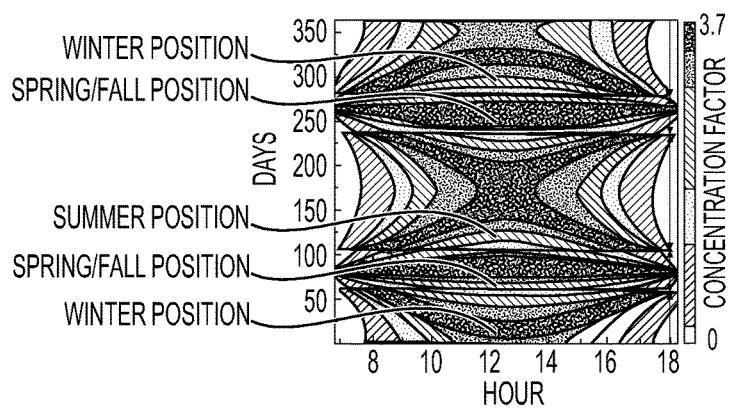
Figure 12C:
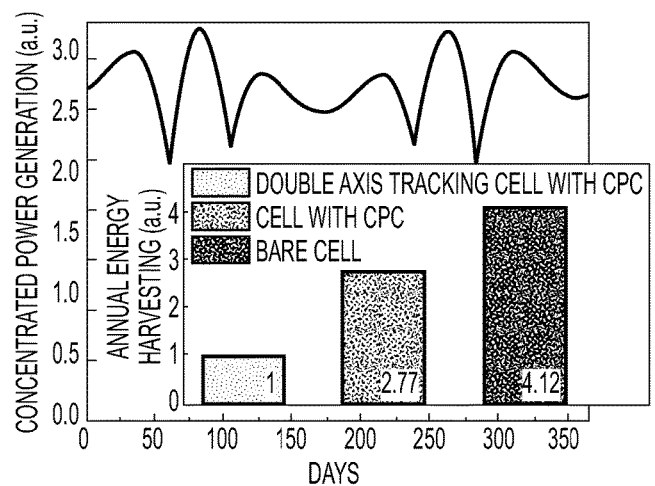

FIG. 12(b) shows the daily and hourly trends of concentrated power generation using the 6°-tilted CPC. The wide CPC acceptance angle allows for energy harvesting during the most useful hours of daylight straddling midday. FIG. 12(c) shows the result of concentrated energy harvesting throughout the year using a thin-film GaAs solar cell with the 6° tilted CPC compared to conventional, non-concentrated cells. Both cases are calculated based on three seasonal positional adjustments each year. The inset of FIG. 12(c) compares the annual energy generation of concentrated and non-concentrated thin-film GaAs solar cells. The total annual energy yield was found to be 2.8× higher for the concentrated cells.

The system, devices and methods described herein will be further described by the following non-limiting examples, which are intended to be purely exemplary.

EXAMPLES

The following example demonstrates a method to integrate a thin film GaAs solar cell with a low-cost plastic mini-compound parabolic concentrator (CPC) by combining the non-destructive ELO (ND-ELO), cold-weld bonding and a vacuum-assisted thermoforming processes.

Example 1

Epitaxial Growth

Solar cell epitaxial layer structures were grown by gas-source molecular beam epitaxy (GSMBE) on Zn-doped (100) p-GaAs substrates. The growth started with a GaAs buffer layer (0.2 μm thick) followed by InGaP/GaAs (100 nm/100 nm) protection layers, and the AlAs (20 nm) sacrificial layer.

Next, an inverted active device region was grown as follows: $5\times10^{18}$ cm$^{-3}$ Be-doped GaAs (0.15 μm) contact layer, $2\times10^{18}$ cm$^{-3}$ Be-doped Al$_{0.20}$In$_{0.49}$Ga$_{0.31}$P (0.025 μm) window, $1\times10^{18}$ cm$^{-3}$ Be-doped p-GaAs (0.15 μm) emitter layer, $2\times10^{17}$ cm$^{-3}$ Si-doped n-GaAs (3.0 μm) base layer, $6\times10^{17}$ cm$^{-3}$ Si-doped In$_{0.49}$Ga$_{0.51}$P (0.05 μm) back surface field (BSF) layer, and $5\times10^{18}$ cm$^{-3}$ Si-doped n-GaAs (0.1 μm) contact layer. The GaAs/AlAs layers were grown at 600° C. and Al$_{0.20}$In$_{0.49}$Ga$_{0.31}$P/In$_{0.49}$Ga$_{0.51}$P layers were grown at 480° C.

Pre-Mesa Patterning, Cold Weld Bonding and Epitaxial Lift-Off

FIG. 1(a) shows the schematic illustration of fabrication flow for pre-mesa patterning, cold welding and ELO process. 2.5 mm×6.5 mm Cr/Au (4 nm/350 nm) mesas were patterned by photolithography using a LOR 3A and S-1827 (Microchem) bi-layer photoresist used as a mask for mesa etching using H$_3$PO$_4$:H$_2$O$_2$: deionized H$_2$O (3:1:25) and HCl: H$_3$PO$_4$ (3:1) for GaAs and InGaP, respectively. The patterned Au on the epitaxial GaAs wafer was bonded to the Au-coated 25 μm thick Kapton® sheet using an EVG 520 wafer bonder at ~10$^{-5}$ torr. Then, 4 MPa with a 80 N/sec ramp rate was applied to the 2 inch-diameter substrate to establish a bond between the Au films. The temperature was increased to 230° C. at 25° C./min and held at temperature for 8 min. The substrate was then rapidly cooled. To apply uniform pressure, a soft graphite sheet was inserted between the sample and the press head. Once the GaAs substrate fully adhered to the Kapton® sheet, the thin active device region was removed from its parent substrate using ND-ELO. The sample was immersed in a 20% HF:H$_2$O maintained at 60° C. while agitating the solution with a stir bar at 900 rpm. The total lift-off time was 30 min.

Solar Cell Fabrication

Following lift-off, the thin-film active region and flexible plastic host was fixed to a rigid substrate using Kapton® tape. The front surface contact grid was photo-lithographically patterned using the LOR 3A and S-1827 (Microchem) bi-layer photoresist; then a Pd(5 nm)/Zn(20 nm)/Pd(20 nm)/Au(700 nm) metal contact was deposited by e-beam evaporation. The widths of the grid and bus bar were 20 μm and 150 μm, respectively, and the spacing between the grid fingers was 300 μm. The total coverage of the solar cell active area by the metallization was 4%. After the metal layer was lifted-off, the highly-doped 100 nm p++ GaAs contact layer was selectively removed by plasma etching. The thin-film solar cells were annealed in air for 1 hr at 200° C. to form ohmic contacts. An anti-reflection coating bilayer comprised of 49 nm thick TiO$_2$ and 81 nm thick MgF$_2$ was deposited by e-beam evaporation. The solar cells on the plastic sheet were covered by a plastic film to protect them from debris generated during dicing along the etched trench using a CO$_2$ laser cutter (50 W Universal Laser Systems) with 2.5 W power, and 500 pulses per inch.

Vacuum-Assisted Thermoforming of the CPCs

FIG. 2 shows the schematic illustration of vacuum-assisted thermoforming process for CPCs fabrication. The polyethylene terephthalate glycol-modified (PETG) sheet was fixed with Kapton® tape across the top of a metal mold containing holes at its base. While vacuum was applied through the holes, the assembly was placed in an oven at 60° C. The PETG is drawn into the mold as the oven temperature was raised to 96° C. for ~15 min, forming the compound parabolic shape. The CPC was then cooled, after which CPC was detached from the metal mold.

Characterization of Concentrated GaAs Photovoltaic

An Oriel solar simulator (model: 91191) with a Xe arc lamp and AM 1.5 Global filter was used for I-V measurements obtained with an Agilent 4155B parameter analyzer. The simulator intensity was calibrated using a National Renewable Energy Laboratory (NREL) certified Si reference cell with diameter of 5 mm. The light incident angle was adjusted using an optical fiber and rotation stage (Newport, 481-A). The concentration factor under diffuse illumination (N-BK7 ground glass diffusers, 220 grit polish, Thorlab) was measured with an identical set-up. The solar cell operating temperature was measured by a thermal imaging camera (A325, FLIR).

Properties related to the solar cell operating temperature is provided in FIG. 10(c). This shows both the measured and calculated values of the concentration factor as functions of the solar incidence angle for the 92% height-truncated, 6° tilted CPC under both direct and diffuse illumination. In addition, FIG. 10(d) shows the thermal performance of both substrate-based and thin film GaAs solar cells under 3.3 suns concentration.

Example 2

The following example demonstrates a similar method to one described to integrate a thin film GaAs solar cell with a low-cost plastic mini-compound parabolic concentrator (CPC) by combining the non-destructive ELO (ND-ELO), cold-weld bonding and a vacuum-assisted thermoforming processes.

As in Example 1, FIG. 2 shows the fabrication flow chart for the vacuum-assisted thermoformed cylindrical plastic mini CPC created using a negative vacuum mold. First, a PETG (Polyethylene terephthalate glycol-modified) plastic substrate with a low glass transition temperature (81° C.) was mounted on a negative compound-parabola shaped mold and placed in the furnace. At the base of the mold, uniformly-spaced small holes connected with the vacuum pump were used to pull the heated substrate (to 105° C.) downwards until it conformed to the mold shape.

The deformed substrate was then cooled to room temperature where it held its shape. Subsequently, the reflector was coated with a 5 nm thick Ge wetting layer and a 200 nm thick Ag reflecting layer on its inner surface using electron-beam and thermal evaporation, respectively. Prior to the deposition, the substrate was cleaned in a sequence of deionized water, tergitol, and isopropyl alcohol for 5 min each.

For the fabrication of thin film GaAs photovoltaic cells, the epitaxial layer structures were grown by gas-source molecular beam epitaxy (GSMBE) on Zn-doped (100) p-GaAs substrates. The growth started with a 0.2 µm-thick GaAs buffer layer followed by a 0.025 µm-thick AlAs sacrificial layer. Then, an inverted active device region (p-on-n GaAs solar cell active region) was grown as follows: 0.15 µm-thick, $5 \times 10^{18}$ cm$^{-3}$ Be-doped GaAs contact layer, 0.025 µm-thick, $2 \times 10^{18}$ cm$^{-3}$ Be-doped $Al_{0.25}Ga_{0.26}In_{0.49}P$ window layer, 0.15 µm-thick, $1 \times 10^{18}$ cm$^{-3}$ Be-doped p-GaAs emitter layer, 3.5 µm-thick, $2 \times 10^{17}$ cm$^{-3}$ Si-doped n-GaAs base layer, 0.05 µm-thick, $4 \times 10^{17}$ cm$^{-3}$ Si-doped $In_{0.49}Ga_{0.51}P$ back surface field (BSF) layer, and a 0.1 µm-thick, $5 \times 10^{18}$ cm$^{-3}$ Si-doped n-GaAs contact layer.

After growth using GSMBE, a 0.005 µm-thick Ir layer was sputtered onto a 50 µm-thick Kapton® sheet as an adhesion layer. Ir was also utilized as stressor layer to accelerate the ELO process. Then, 0.5 µm-thick Au contact layer was deposited onto both the Ir coated Kapton® sheet and GaAs epitaxial layer by e-beam evaporation.

The substrate and plastic sheet were bonded by thermally-assisted cold-welding which consisted of applying a 4 kN force at 200° C. with an EAG 520 wafer bonding tool and then was subsequently submerged into a heated solution of 20% HF for epitaxial lift-off. The lifted-off thin film was fabricated into solar cells starting with the front contact grid patterning using photolithography and deposition of Pd (0.005 µm)/Zn(0.02 µm)/Pd(0.015 µm)/Au(0.7 µm) by e-beam evaporation. The device was then annealed for 30 min at 200° C. to form Ohmic contacts.

Mesas were defined using photolithography and wet etching, and the highly-doped GaAs ohmic contact layer was removed between the gridlines. Finally, a $TiO_2$ (0.052 µm)/ $MgF_2$ (0.085 µm) bi-layer antireflective coating was deposited by e-beam evaporation.

Figure 4:
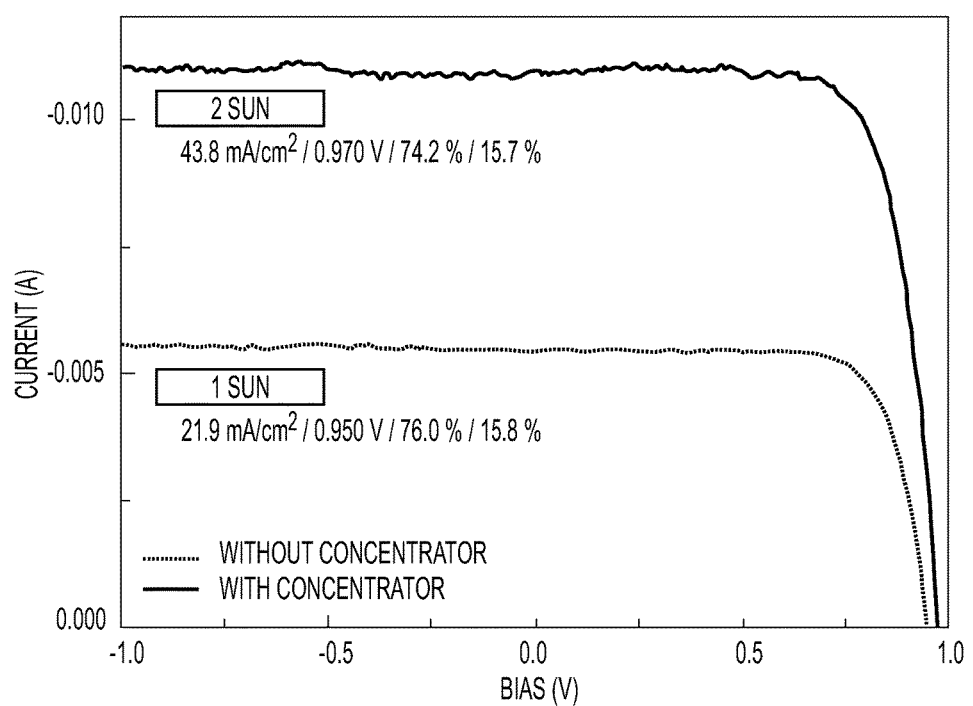
FIG. 4 is a graph showing current-voltage characteristics of ND-ELO processed GaAs thin film solar cell with and without a CPC measured under simulated one sun illumination.

The fourth quadrant current-voltage (I-V) characteristics of the ND-ELO processed GaAs solar cell with and without a plastic mini-CPC, measured under simulated Atmospheric Mass 1.5 Global (AM 1.5G) illumination at 100 mW/cm$^2$ intensity, is presented in FIG. 4. The optical power intensity was calibrated using a National Renewable Energy Laboratory traceable Si reference photovoltaic cell. The short circuit current density is 21.9 mA/cm$^2$, and the open circuit voltage is 0.95 V, the fill factor is 76%, resulting in a power conversion efficiency of 15.8% without the CPC.

The CPC was designed with 1:3 ratio of device and opening area by truncating the 50% height of the 20° tilted parabola. The 20° CPC provides the same concentration factor over a 40° acceptance angle. The GaAs thin film solar cell integrated with the CPC shows twice the short circuit current compared with the same cell without the concentrator, therefore leading to double the power generation, as shown in FIG. 4.

Figure 9A:
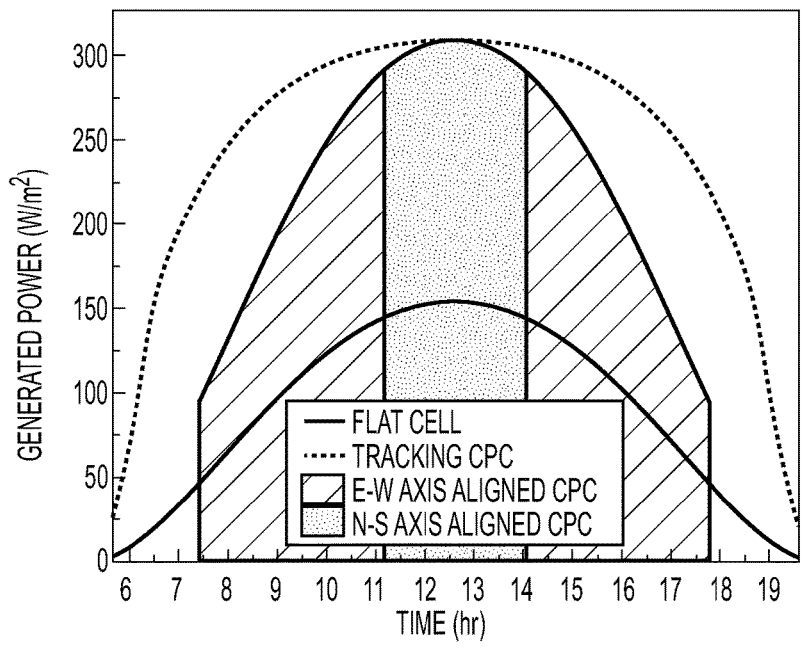
FIGS. 9(a) and 9(b) show a comparison of the power generation from tilted solar cells with and without the CPC and tracking for summer (9a) and winter (9b), at Phoenix, Ariz.
Figure 9B:
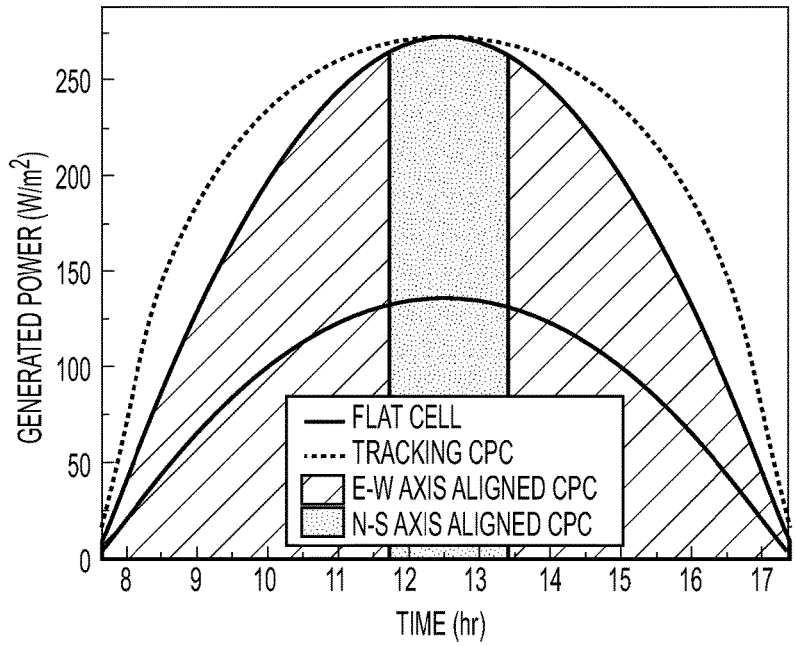

FIGS. 9(a) and 9(b) show comparisons of power generation from thin film GaAs photovoltaic cells made according to this example, with and without concentrator tracking as a function of seasonal conditions (January 1st and July 15th). These comparisons are calculated based on the coordinates of Phoenix, Ariz. (33.4N, 112.1W). Solar radiation intensity is calculated as a function of time using time dependent zenith angles and air mass. Diffused light is not considered for the calculation.

Energy harvesting values are then calculated by integrating the power incident on each device as a function of time throughout the course of one day. First, the power generated from a non-tracking tilted solar cell was compared with and without CPC integration. Both cases have the cells pointed with a 7.6° north and 67.75° south zenith angle for summer, and winter, respectively.

The GaAs thin film solar cell with CPC aligned with a north-south axis only collects 68% and 50% of the radiation compared with tilted flat solar cell for summer and winter, respectively. This is because of the limited acceptance angle of the CPC. On the other hand, tilted GaAs thin film solar cells with the CPC aligned along an east-west axis generates 1.9 and 2 times more power compared with a tilted flat cell for summer and winter, respectively. This is mainly due to alignment between the mini CPC coverage and the solar path. If the cell with the mini CPC tracks the sunlight, the concentration factors are even further enhanced to 2.72 and 2.33 times compared with a flat GaAs solar cell of equal area for summer and winter, respectively.

The description of the embodiments herein had been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for integrating a thin-film solar cell with non-tracking miniconcentrators, said method comprising:
   providing a growth substrate;
   depositing at least one protection layer on the growth substrate;
   depositing at least one sacrificial layer on the at least one protection layer;
   depositing a photoactive cell on the sacrificial layer, wherein the photoactive cell is inverted;
   forming a patterned metal layer comprising an array of mesas on the photoactive cell by a photolithography method, wherein the mesas are separated by one or more trenches that extend through the patterned metal layer and the photoactive cell to the sacrificial layer;
   bonding the patterned metal layer to a metallized surface of a plastic sheet;
   etching the sacrificial layer with one or more etch steps that remove the photoactive cell from the growth substrate to form thin film solar cells bonded to the plastic sheet;
   dicing the thin film solar cells bonded to the plastic sheet along the one or more trenches;
   fabricating compound parabolic concentrators from a plastic material; and
   transferring the thin film solar cells onto the compound parabolic concentrators by an adhesive-free bonding step to form an integrated thin film solar cell and compound parabolic concentrator.

2. The method of claim 1, wherein the growth substrate comprises GaAs or InP.

3. The method of claim 1, wherein the at least one protection layer is lattice matched with the growth substrate.

4. The method of claim 3, wherein the at least one protection layer is selected from AlAs, GaAs, InP, InGaAs, AlInP, GaInP, InAs, InSb, GaP, AlP, GaSb, AlSb, and combinations thereof.

5. The method of claim 1, wherein at least one of the protection layer, sacrificial layer, or photoactive cell is deposited by at least one process chosen from gas source molecular beam epitaxy (GSMBE), metallo-organic chemical vapor deposition (MOCVD), hydride vapor phase epitaxy (HVPE), solid source molecular beam epitaxy (SSMBE), and chemical beam epitaxy.

6. The method of claim 1, wherein the at least one protection layer comprises a buffer layer, an etch-stop layer, or combinations thereof.

7. The method of claim 1, wherein said photolithography method comprises depositing a metal layer on the photoactive cell; depositing a mask on top of the metal layer for mesa etching; and performing at least one etch step through said mask to form the mesas separated by the one or more trenches.

8. The method of claim 7, wherein the at least one etch step comprises etching the metal layer and the photoactive cell with a wet etchant, a dry etchant, or combinations thereof.

9. The method of claim 8, wherein said wet etchant comprises HF, $H_3PO_4$, HCl, $H_2SO_4$, $H_2O_2$, $HNO_3$, $C_6H_8O_7$, and combinations thereof, including combinations with $H_2O$.

10. The method of claim 8, wherein said dry etchant comprises reactive ion etching (RIE) with a plasma.

11. The method of claim 1, wherein the sacrificial layer comprises AlAs, and the one or more etch steps comprise contacting said AlAs with HF.

12. The method of claim 1, wherein the one or more trenches have a width ranging from 100 µm to 500 µm.

13. The method of claim 1, wherein the photoactive cell comprises a multi-junction cell.

14. The method of claim 1, wherein the step of bonding the patterned metal layer to the plastic sheet comprises a direct attachment method selected from cold-welding, thermally assisted cold-welding, and thermocompression bonding.

15. The method of claim 1, wherein the thin film solar cells bonded to the plastic sheet are diced using a laser.

16. The method of claim 15, wherein the laser is a $CO_2$ laser.

17. The method of claim 1, wherein transferring the thin film solar cells onto the compound parabolic concentrators comprises attaching the thin-film solar cells to an elastomeric stamp and transfer printing the solar cells onto a metallized surface of the compound parabolic concentrators.

18. The method of claim 17, wherein the metalized surface of the compound parabolic concentrators comprises at least one metal chosen from Au, Ag, Pt, Pd, Ni, and Cu.

19. The method of claim 1, wherein the plastic material has a glass transition temperature below 100° C.

20. The method of claim 1, wherein the plastic material comprises polyethylene terephthalate glycol-modified.

21. The method of claim 1, wherein fabricating the compound parabolic concentrators comprises at least one thermoforming process, wherein the at least one thermoforming process comprises mounting the plastic material on a negative compound-parabola shaped vacuum mold.

22. The method of claim 21, wherein a vacuum is used to pull the plastic material to the surface of the mold, to conform the plastic material to the shape of the mold while the plastic material is heated above its glass transition temperature.

23. The method of claim 22, wherein the plastic material is subsequently cooled to room temperature where it holds its shape as a compound parabola.

24. The method of claim 1, wherein the plastic material is coated with at least one wetting layer and at least one metal reflecting layer.

25. The method of claim 24, wherein the at least one wetting layer comprises Ge.

26. The method of claim 24, wherein the at least one metal reflecting layer comprises Ag.

27. The method of claim 24, wherein the at least one wetting layer and the at least one metal reflecting layer are deposited using electron-beam, thermal evaporation, or combinations thereof.

* * * * *